United States Patent
Itoh

(10) Patent No.: US 10,908,487 B1
(45) Date of Patent: Feb. 2, 2021

(54) LIGHT EMITTING DEVICE AND PROJECTOR

(71) Applicant: Seiko Epson Corporation, Tokyo (JP)

(72) Inventor: Yoshitaka Itoh, Matsumoto (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 16/941,724

(22) Filed: Jul. 29, 2020

(30) Foreign Application Priority Data

Jul. 30, 2019 (JP) ................................ 2019-139486

(51) Int. Cl.

| G03B 21/14 | (2006.01) |
|---|---|
| H04N 9/31 | (2006.01) |
| H01S 5/12 | (2006.01) |
| G03B 21/20 | (2006.01) |
| H01S 5/40 | (2006.01) |

(52) U.S. Cl.
CPC ..... *G03B 21/2013* (2013.01); *G03B 21/2033* (2013.01); *H01S 5/12* (2013.01); *H01S 5/1206* (2013.01); *H01S 5/4093* (2013.01); *H04N 9/3161* (2013.01); *H04N 9/3164* (2013.01)

(58) Field of Classification Search
CPC .... H01S 5/34346; H01S 5/34333; H01S 5/12; H01S 5/1215; H01S 5/1206; H01S 5/40; H01S 5/4031; H01S 5/4093; G03B 21/14; G03B 21/2033; H04N 9/31; H04N 9/3161; H04N 9/3194
See application file for complete search history.

(56) References Cited

U.S. PATENT DOCUMENTS

| 5,978,403 | A | 11/1999 | Iwasa et al. | |
|---|---|---|---|---|
| 7,772,606 | B2 * | 8/2010 | Cao | H04N 9/3129 |
| | | | | 257/98 |
| 10,734,789 | B2 * | 8/2020 | Nishioka | H01S 5/18344 |
| 2010/0284432 | A1 | 11/2010 | Hoshino et al. | |
| 2013/0242267 | A1 | 9/2013 | Ogura et al. | |
| 2020/0041889 | A1 * | 2/2020 | Ishizawa | G03B 21/2033 |
| 2020/0067271 | A1 * | 2/2020 | Akasaka | G03B 21/2013 |

FOREIGN PATENT DOCUMENTS

| JP | H10-107386 A | 4/1998 |
|---|---|---|
| JP | 2009-164466 A | 7/2009 |
| JP | 2010-263062 A | 11/2010 |
| JP | 2013-190591 A | 9/2013 |

* cited by examiner

*Primary Examiner* — William C. Dowling

(74) *Attorney, Agent, or Firm* — Harness, Dickey & Pierce, P.L.C.

(57) ABSTRACT

A light emitting device includes resonant parts constituted by a photonic crystal structure, and rows each of which includes the resonant parts arranged along a first direction, wherein light resonating in the resonant part resonates in a first resonant direction and a second resonant direction, the rows are arranged along a second direction, the rows include a first row, and a second row, a distance between the resonant part located furthest at one side of the first direction in the first row and the resonant part located furthest at the one side of the first direction in the second row is different from a distance between the resonant part located furthest at the one side of the first direction and the resonant part located furthest at another side of the first direction in the first row, the first and second resonant directions are along the first and second axes respectively, and in a plan view a length along the first direction of the resonant part and a length along the second direction of the resonant part are equal to each other.

5 Claims, 8 Drawing Sheets

LIGHT EMITTING DEVICE AND PROJECTOR

The present application is based on, and claims priority from JP Application Serial Number 2019-139486, filed Jul. 30, 2019, the disclosure of which is hereby incorporated by reference herein in its entirety.

BACKGROUND

1. Technical Field

The present disclosure relates to a light emitting device and a projector.

2. Related Art

A projector using a semiconductor laser element as a light source has been put into practical use.

In JP-A-2013-190591, for example, there is described a projector provided with a red light source device, a blue light source device, and a green light source device formed of a fluorescence emitting device which is excited by outgoing light from an excitation light source device.

As a light source of such a projector as described above, there is demanded a light emitting device for emitting light having an isotropic light distribution angle. When using the light emitting device for emitting the light having the isotropic light distribution angle, since the cross-sectional shape is a circular shape, and thus, the light having a homogenous intensity distribution can be obtained, it is possible to efficiently excite a phosphor when, for example, exciting the phosphor.

SUMMARY

A light emitting device according to an aspect of the present disclosure includes p resonators each having a resonant part constituted by a photonic crystal structure, wherein light resonating in the resonant part resonates in a plurality of resonant directions, in the resonant part, lengths in the plurality of resonant directions are all equal to each other, q of the resonant parts are arranged along a first direction to form a row, the rows are arranged along a second direction as much as r, p=q×r is true, a distance between the resonant part located furthest at one side of the first direction in the row located furthest at one side of the second direction of the r rows and the resonant part located furthest at the one side of the first direction in the row located furthest at another side of the second direction of the r rows is different from a distance between the resonant part located furthest at the one side of the first direction and the resonant part located furthest at another side of the first direction in the row located furthest at the one side of the second direction of the r rows, the plurality of resonant directions includes a direction along the first direction and a direction along the second direction, and in a plan view viewed from a direction along a third direction perpendicular to a plane including the first direction and the second direction, a length along the first direction of the resonant part and a length along the second direction of the resonant part are equal to each other.

In the light emitting device according to the above aspect, nano-structures of the photonic crystal structure may be arranged so as to form a square lattice, the first direction and the second direction may be perpendicular to each other, and the plurality of resonant directions may correspond to the direction along the first direction and the direction along the second direction.

In the light emitting device according to the above aspect, nano-structures of the photonic crystal structure may be arranged so as to form an equilateral-triangular lattice, the second direction may be tilted 120° with respect to the first direction, and the plurality of resonant directions may correspond to a direction along the first direction, a direction along the second direction, and a direction along a fourth axis tilted 60° with respect to the first direction.

A projector according to another aspect of the present disclosure includes the light emitting device according to one of the above aspects.

The projector according to the above aspect may further include a light collection optical system configured to collect light emitted from the light source device, and a phosphor to be excited by light emitted from the light collection optical system.

DESCRIPTION OF EXEMPLARY EMBODIMENTS

Some preferred embodiments of the present disclosure will hereinafter be described in detail using the drawings. It should be noted that the embodiments described hereinafter do not unreasonably limit the contents of the present disclosure as set forth in the appended claims. Further, all of the constituents described hereinafter are not necessarily essential elements of the present disclosure.

1. First Embodiment

1.1. Light Emitting Device

Figure 1:
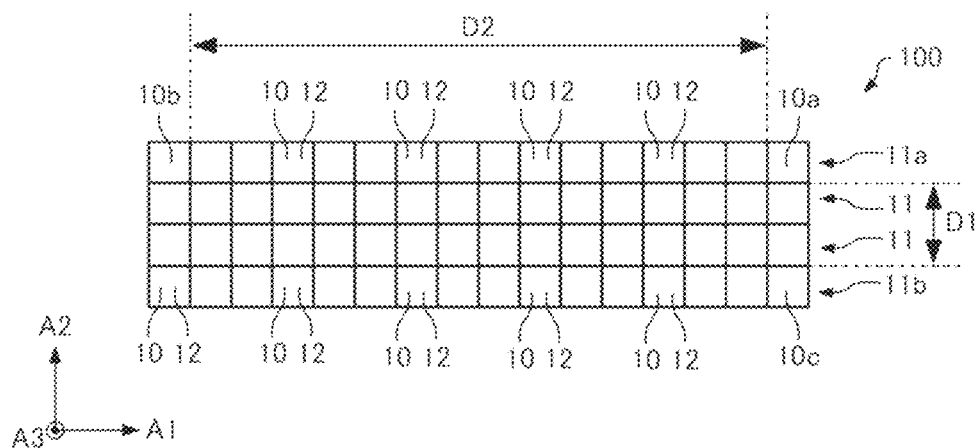
FIG. 1 is a plan view schematically showing a light emitting device according to a first embodiment.

Firstly, a light emitting device according to a first embodiment will be described with reference to the drawings. FIG. 1 is a plan view schematically showing the light emitting device 100 according to the first embodiment, namely the present embodiment. It should be noted that in FIG. 1, a first direction A1, a second direction A2, and a third direction A3 are shown as three axes crossing each other. In the illustrated example, the first direction A1, the second direction A2, and the third direction A3 are perpendicular to each other.

As shown in FIG. 1, the light emitting device 100 has resonators 12 each having a resonant part 10. The light emitting device 100 has p pieces of the resonators 12. In other words, the light emitting device 100 has p pieces of the resonant parts 10. In the illustrated example, the light emitting device 100 has 64 resonant parts 10. The resonant part 10 is a part where the light resonates.

A row 11 of the resonant parts 10 is formed by q of the resonant parts 10 arranged along the first direction A1. In the illustrated example, the row 11 of the resonant parts 10 is formed by 16 of the resonant parts 10 arranged along the first direction A1. There are arranged the rows as much as r along the second direction A2. In the illustrated example, there are arranged the rows 11 as much as 4 along the second direction A2. It should be noted that p=q×r is true. In the illustrated example, the p resonant parts 10 are arranged in a matrix in a direction along the first direction A1 and a direction along the second direction A2. The p resonant parts 10 are, for example, the same in shape and size.

A row 11a is a first row which is one of the r rows 11, and is located the furthest at one side (in the +A2 axis direction in the illustrated example) of the second direction A2. A resonant part 10a is one of the resonant parts 10, and is located the furthest at one side (in the +A1 axis direction in the illustrated example) of the first direction A1 in the row 11a. A resonant part 10b is one of the resonant parts 10, and is located the furthest at the other side (in the −A1 axis direction in the illustrated example) of the first direction A1 in the row 11a.

A row 11b is a second row which is one of the r rows 11, and is located the furthest at the other side (in the −A2 axis direction in the illustrated example) of the second direction A2. A resonant part 10c is one of the resonant parts 10, and is located the furthest at the one side (in the +A1 axis direction in the illustrated example) of the first direction A1 in the row 11b.

A distance D1 between the resonant part 10a and the resonant part 10c and a distance D2 between the resonant part 10a and the resonant part 10b are different from each other. In a plan view (hereinafter simply referred to as "in the plan view") viewed from a direction along the third direction A3 perpendicular to a plane including the first direction A1 and the second direction A2, a distance between the center of the resonant part 10a and the center of the resonant part 10c is different from a distance between the center of the resonant part 10a and the center of the resonant part 10b. In the illustrated example, the distance D1 between the resonant part 10a and the resonant part 10c is shorter than the distance D2 between the resonant part 10a and the resonant part 10b.

Figure 2:
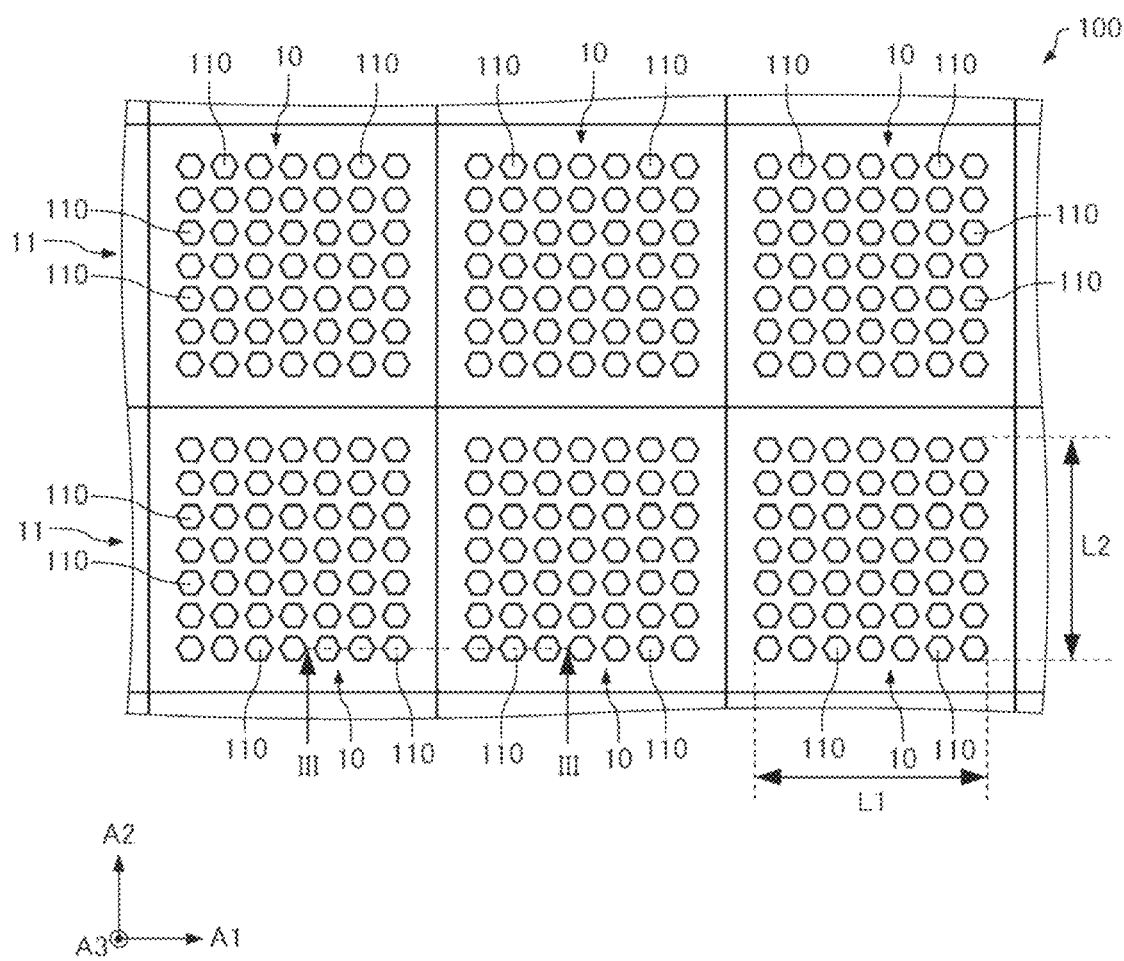
FIG. 2 is a plan view schematically showing the light emitting device according to the first embodiment.
Figure 3:
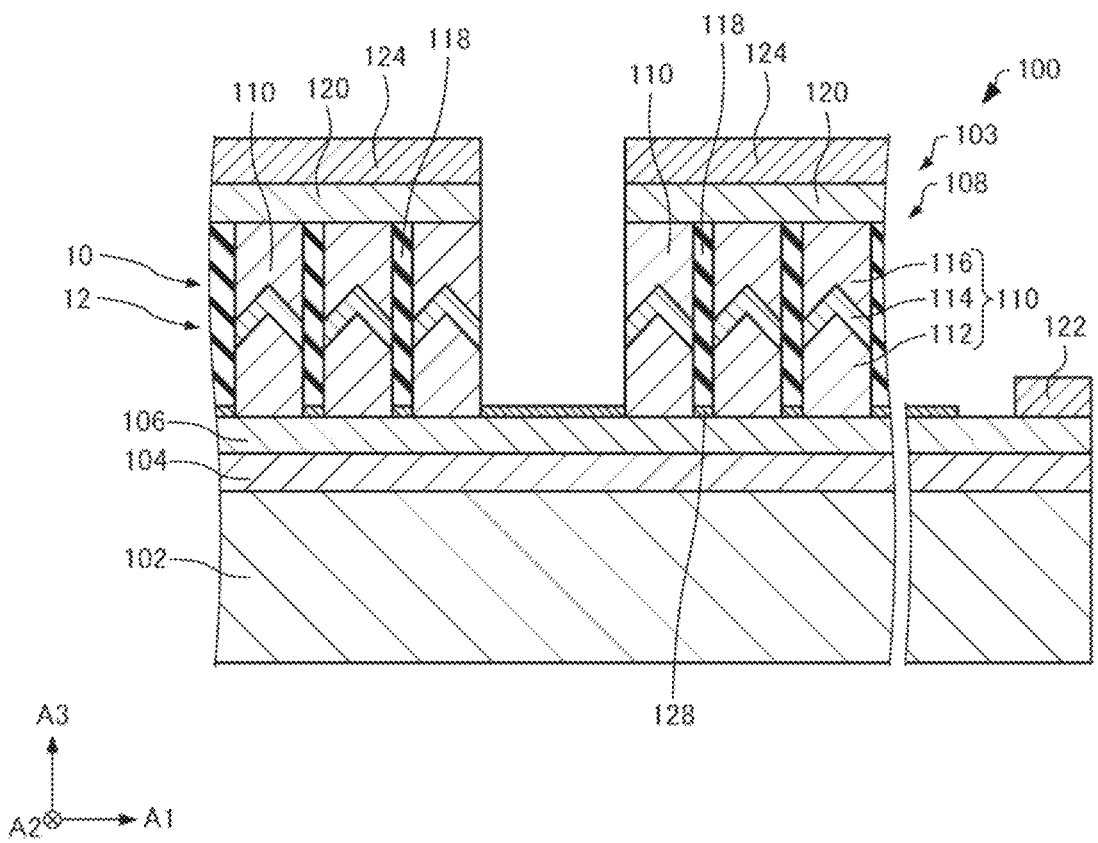
FIG. 3 is a cross-sectional view schematically showing the light emitting device according to the first embodiment.

Here, FIG. 2 is the plan view schematically showing the light emitting device 100 according to the first embodiment, namely the present embodiment. FIG. 3 is a cross-sectional view along the line III-III shown in FIG. 2, and schematically shows the light emitting device 100 according to the first embodiment, namely the present embodiment.

As shown in FIG. 2 and FIG. 3, the light emitting device 100 has, for example, a substrate 102, a stacked body 103 disposed on the substrate 102, a first electrode 122, and a second electrode 124. The stacked body 103 has a reflecting layer 104, a buffer layer 106, a photonic crystal structure 108, and a semiconductor layer 120. It should be noted that in FIG. 1, the light emitting device 100 is illustrated in a simplified manner for the sake of convenience. Further, in FIG. 2, the illustration of members other than columnar parts 110 of the photonic crystal structure 108 is omitted.

The substrate 102 is, for example, an Si substrate, a GaN substrate, or a sapphire substrate.

The reflecting layer 104 is disposed on the substrate 102. The reflecting layer 104 is, for example, a DBR (distributed Bragg reflector) layer. The reflecting layer 104 is, for example, what is obtained by alternately stacking AlGaN layers and GaN layers at one another or what is obtained by alternately stacking AlInN layers and GaN layers on one another. The reflecting layer 104 reflects the light generated by a light emitting layer 114 of each of columnar parts 110 of the photonic crystal structure 108 toward the second electrode 124.

It should be noted that in the present specification, when taking the light emitting layer 114 as a reference in the stacking direction (hereinafter also referred to simply as a "stacking direction") of the stacked body 103, the description will be presented assuming a direction from the light emitting layer 114 toward a semiconductor layer 116 as an "upward direction," and a direction from the light emitting layer 114 toward a semiconductor layer 112 as a "downward direction." Further, the "stacking direction of the stacked body" denotes a stacking direction of the semiconductor layer 112 and the light emitting layer 114.

The buffer layer 106 is disposed on the reflecting layer 104. The buffer layer 106 is a layer made of semiconductor such as an Si-doped n-type GaN layer. In the illustrated example, on the buffer layer 106, there is disposed a mask layer 128 for growing the columnar parts 110. The mask layer 128 is, for example, a silicon oxide layer or a silicon nitride layer.

The photonic crystal structure 108 is disposed on the buffer layer 106. The photonic crystal structure 108 has, for example, the columnar parts 110 and light propagation layers 118.

The photonic crystal structure 108 can develop an effect of the photonic crystal, and the light emitted by the light emitting layers 114 of the photonic crystal structure 108 is confined in an in-plane direction of the substrate 102, and is emitted in the stacking direction. Here, the "in-plane direction of the substrate 102" denotes a direction perpendicular to the stacking direction.

The columnar parts 110 are disposed on the buffer layer 106. The planar shape of the columnar part 110 is a polygonal shape such as a regular hexagon, a circle, or the like. In the example shown in FIG. 2, the planar shape of the columnar part 110 is a regular hexagon. The diametrical size of the columnar part 110 is, for example, in a nanometer-order range, and is specifically not smaller than 10 nm and not larger than 500 nm. The columnar part 110 is a nanostructure constituting the photonic crystal structure 108. The size in the stacking direction of the columnar part 110 is, for example, not smaller than 0.1 μm and not larger than 5 μm.

It should be noted that when the planar shape of the columnar part 110 is a circle, the "diametrical size" denotes the diameter of the circle, and when the planar shape of the columnar part 110 is not a circle, the "diametrical size" denotes the diameter of a minimum enclosing circle. For example, when the planar shape of the columnar part 110 is a polygonal shape, the diametrical size of the columnar part 110 is the diameter of a minimum circle including the polygonal shape inside, and when the planar shape of the columnar part 110 is an ellipse, the diametrical size of the columnar part 110 is the diameter of a minimum circle including the ellipse inside. Further, when the planar shape of the columnar part 110 is a circle, the "center of the columnar part 110" denotes the center of the circle, and when the planar shape of the columnar part 110 is not a circle, the "center of the columnar part 110" denotes the center of the minimum enclosing circle. For example, when the planar shape of the columnar part 110 is a polygonal shape, the center of the columnar part 110 is the center of a minimum circle including the polygonal shape inside, and when the planar shape of the columnar part 110 is an ellipse, the center of the columnar part 110 is the center of a minimum circle including the ellipse inside.

The number of the columnar parts 110 disposed is more than one. An interval between the columnar parts 110 adjacent to each other is, for example, not smaller than 1 nm and not larger than 500 nm. The columnar parts 110 are periodically disposed in a predetermined direction at a predetermined pitch.

In the example shown in FIG. 2, the columnar parts 110 are arranged so as to form a square lattice. In the illustrated example, the columnar parts 110 are arranged along the first direction A1 at a predetermined pitch, and are arranged along the second direction A2 at a predetermined pitch. The pitch along the first direction A1 of the columnar parts 110 and the pitch along the second direction A2 of the columnar parts 110 are equal to each other. The pitch along the first direction A1 of the columnar parts 110 mentioned here is a distance between the centers of the columnar parts 110 adjacent to each other along the first direction A1. The pitch along the second direction A2 of the columnar parts 110 means a distance between the centers of the columnar parts 110 adjacent to each other along the second direction A2.

As shown in FIG. 3, the columnar parts 110 each have the semiconductor layer 112, the light emitting layer 114, and the semiconductor layer 116.

The semiconductor layer 112 is disposed on the buffer layer 106. The semiconductor layer 112 is, for example, the Si-doped n-type GaN layer.

The light emitting layer 114 is disposed on the semiconductor layer 112. The light emitting layer 114 is disposed between the semiconductor layer 112 and the semiconductor layer 116. The light emitting layer 114 has a quantum well structure constituted by, for example, a GaN layer and an InGaN layer. The light emitting layer 114 is a layer capable of emitting light in response to injection of an electrical current.

The semiconductor layer 116 is disposed on the light emitting layer 114. The semiconductor layer 116 is a layer different in conductivity type from the semiconductor layer 112. The semiconductor layer 116 is, for example, an Mg-doped p-type GaN layer. The semiconductor layers 112, 116 are cladding layers having a function of confining the light in the light emitting layer 114.

The light propagation layer 118 is disposed between the columnar parts 110 adjacent to each other. In the illustrated example, the light propagation layers 118 are disposed on the mask layer 128. The refractive index of the light propagation layer 118 is lower than, for example, the refractive index of the light emitting layer 114. The light propagation layer 118 is, for example, a silicon oxide layer, an aluminum oxide layer, or a titanium oxide layer. The light generated in the light emitting layer 114 can propagate through the light propagation layer 118.

The resonant part 10 is constituted by the photonic crystal structure 108. The p resonant parts 10 are separated from each other. In the illustrated example, the columnar part 110 is not disposed between the resonant parts 10 adjacent to each other. The p resonant parts 10 have a single substrate 102 as a common substrate. In the resonant parts 10 adjacent to each other, the light resonating in one of the resonant parts 10 does not reach the other of the resonant parts 10. The distance between the resonant parts 10 adjacent to each other is longer than the wavelength of the light generated in the light emitting layer 114. Thus, in the resonant parts 10 adjacent to each other, it is possible to prevent the light resonating in one of the resonant parts 10 from reaching the other of the resonant parts 10.

It should be noted that although not shown in the drawings, it is possible to dispose a light absorption part for absorbing light between the resonant parts 10 adjacent to each other. The light absorption part is formed of a substance having a narrower bandgap than the light resonating in the resonant part 10. As the substance, there can be cited, for example, InGaN and InN. The light absorption part is, for example, a crystalline body having a columnar shape or a wall-like shape. Thus, in the resonant parts 10 adjacent to each other, it is possible to prevent the light resonating in one of the resonant parts 10 from reaching the other of the resonant parts 10.

Further, although not shown in the drawings, it is possible to dispose a light reflection part for reflecting light between the resonant parts 10 adjacent to each other. For example, by disposing the columnar parts 110 smaller in pitch and diametrical size than the columnar parts 110 constituting the resonant part 10 between the resonant parts 10 adjacent to each other, it is possible to form the light reflection part. Thus, in the resonant parts 10 adjacent to each other, it is possible to prevent the light resonating in one of the resonant parts 10 from reaching the other of the resonant parts 10.

Figure 4:
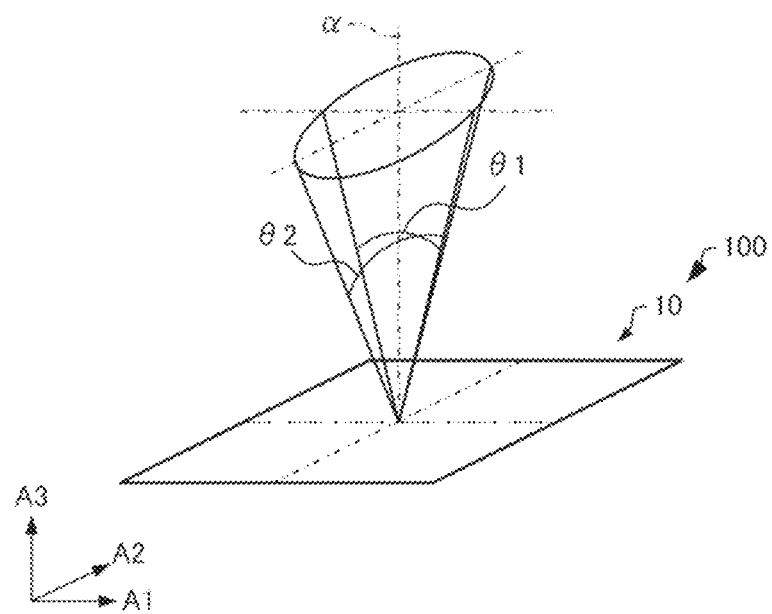
FIG. 4 is a diagram for explaining light emitted from the light emitting device according to the first embodiment.

In the plan view, a length L1 along the first direction A1 of the resonant part 10 and a length L2 along the second direction A2 of the resonant part 10 are equal to each other. Since the length L1 and the length L2 are equal to each other, as shown in FIG. 4, in the light emitted from the resonant part 10, a light distribution angle $\theta 1$ along the first direction A1 and a light distribution angle $\theta 2$ along the second direction A2 become equal to each other. As described above, it is possible to check whether or not the length L1 and the length L2 are equal to each other based on the light distribution angle of the light emitted from the resonant part 10.

In the plan view, the shape of the resonant part 10 is, for example, a square. In the plan view, a diagram formed of straight lines connecting the centers of the columnar parts 110 located at the outermost circumference out of the plurality of columnar parts 110 constituting the resonant part 10 is, for example, a square. When the diagram is a square or a regular hexagon, the light emitted from the resonant part 10 becomes to have a light distribution angle which is rotational symmetry with respect to an emission axis a as shown in FIG. 4. In the illustrated example, the emission axis a is an axis parallel to the third direction A3.

The light resonating in the resonant part 10 resonates in a plurality of resonant directions. In the resonant part 10, the lengths in the plurality of resonant directions are all equal to each other. It is possible to check whether or not the lengths in the resonant directions in the resonant part 10 are all equal to each other based on the light distribution angle of the light emitted from the resonant part 10. The plurality of resonant directions includes a first resonant direction along the first direction A1 and a second resonant direction along the second direction A2. In the illustrated example, the plurality of resonant directions comprises the direction along the first direction A1 and the direction along the second direction A2. In the plan view, for example, in the resonant part 10, a distance between the center of the columnar part 110 located the furthest at the one side of the first direction A1 and the center of the columnar part 110 located the furthest at the other side of the first direction A1 is equal to a distance between the center of the columnar part 110 located the furthest at the one side of the second direction A2 and the center of the columnar part 110 located the furthest at the other side of the second direction A2.

For example, as shown in FIG. 1, a distance between the center of the columnar part 110 located the furthest in the −A2 axis direction out of the plurality of columnar parts 110 constituting the resonant part 10a and the center of the columnar part 110 located the furthest in the +A2 axis direction out of the plurality of columnar parts 110 constituting the resonant part 10c is different from a distance between the center of the columnar part 110 located the furthest in the −A1 axis direction out of the plurality of columnar parts 110 constituting the resonant part 10a and the center of the columnar part 110 located the furthest in the +A1 axis direction out of the plurality of columnar parts 110 constituting the resonant part 10b.

In the light emitting device 100, the p-type semiconductor layer 116, the light emitting layer 114 with no impurity doped, and the n-type semiconductor layer 112 constitute a pin diode. The semiconductor layers 112, 116 are layers larger in bandgap than the light emitting layer 114. In the light emitting device 100, when applying a forward bias voltage of the pin diode between the first electrode 122 and the second electrode 124 to inject a current, there occurs recombination of electrons and holes in the light emitting layer 114. The recombination causes light emission. The light generated in the light emitting layer 114 propagates through the light propagation layer 118 in the in-plane direction of the substrate 102 due to the semiconductor layers 112, 116 to form a standing wave due to the effect of the photonic crystal in the photonic crystal structure 108, and is confined in the in-plane direction of the substrate 102. The light thus confined causes laser oscillation with the gain in the light emitting layer 114. In other words, the light generated in the light emitting layer 114 resonates in the in-plane direction of the substrate 102 due to the photonic crystal structure 108 to cause the laser oscillation. Specifically, the light generated in the light emitting layer 114 resonates in the in-plane direction of the substrate 102 in the resonant part 10 of the resonator 12 constituted by the photonic crystal structure 108 to cause the laser oscillation. Then, positive first-order diffracted light and negative first-order diffracted light proceed in the stacking direction as a laser beam.

The laser beam proceeding toward the reflecting layer 104 out of the laser beam having proceeded in the stacking direction is reflected by the reflecting layer 104, and proceeds toward the second electrode 124. Thus, it is possible for the light emitting device 100 to emit the light from the second electrode 124 side.

The semiconductor layer 120 is disposed on the photonic crystal structure 108. The semiconductor layer 120 is, for example, an Mg-doped p-type GaN layer.

The first electrode 122 is disposed on the buffer layer 106. It is also possible for the buffer layer 106 to have ohmic contact with the first electrode 122. In the illustrated example, the first electrode 122 is electrically coupled to the semiconductor layer 112 via the buffer layer 106. The first electrode 122 is one of the electrodes for injecting the electrical current into the light emitting layer 114. As the first electrode 122, there is used, for example, what is obtained by stacking a Ti layer, an Al layer, and an Au layer in this order from the buffer layer 106 side.

The second electrode 124 is disposed on the semiconductor layer 120. It is also possible for the semiconductor layer 120 to have ohmic contact with the second electrode 124. The second electrode 124 is electrically coupled to the semiconductor layer 116. In the illustrated example, the second electrode 124 is electrically coupled to the semiconductor layer 116 via the semiconductor layer 120. The second electrode 124 is the other of the electrodes for injecting the electrical current into the light emitting layer 114. As the second electrode 124, there is used, for example, ITO (Indium Tin Oxide). The second electrode 124 disposed in one of the photonic crystal structures 108 adjacent to each other and the second electrode 124 disposed in the other of the photonic crystal structure are electrically coupled to each other with an interconnection not shown.

It should be noted that although the light emitting layer 114 of the InGaN type is described above, any types of material capable of emitting light in response to an electrical current injected in accordance with the wavelength of the light emitted can be used as the light emitting layer 114. It is possible to use semiconductor materials such as an AlGaN type, an AlGaAs type, an InGaAs type, an InGaAsP type, an InP type, a GaP type, or an AlGaP type. Further, it is also possible to change the size and the pitch of the arrangement of the columnar parts 110 in accordance with the wavelength of the light emitted.

Further, although the photonic crystal structure 108 has the columnar parts 110 disposed periodically in the above description, it is also possible to have hole parts disposed periodically as a nano-crystal structure in order to develop the photonic crystal effect.

The light emitting device 100 has, for example, the following advantages.

In the light emitting device 100, there are provided the resonators 12 each having the resonant part 10 constituted by the photonic crystal structure 108, and in the plan view, the length L1 along the first direction A1 of the resonant part 10 and the length L2 along the second direction A2 of the resonant part 10 are equal to each other. Therefore, in the light emitting device 100, it is possible to make the light distribution angle along the first direction A1 and the light distribution angle along the second direction A2 equal to each other in the light to be emitted from the resonant part 10. Thus, in the light emitting device 100, it is possible to emit the light having the isotropic light distribution angle in the direction along the first direction direction A1 and the direction along the second direction A2 compared to when the length L1 and the length L2 are different from each other.

Further, in the light emitting device 100, the distance D1 between the resonant parts 10a, 10c and the distance D2 between the resonant parts 10a, 10b are different from each other (e.g., the area where the plurality of resonant parts 10 is disposed has a substantially rectangular shape). Therefore, it is easy to increase the ratio (the length of the circumferential side to the area in an area where the plurality of resonant parts 10 is disposed) of the circumference of the light emitting device 100 compared to when the distance D1 and the distance D2 are equal to each other. The luminous efficiency lowers when the resonant part 10 is heated, but in the light emitting device 100, since a substantially rectangular shape is adopted as the shape of the area where the plurality of resonant parts 10 is arranged, it becomes easy for the resonant part 10 to release the heat, and thus, high light output can be obtained.

1.2. Method of Manufacturing Light Emitting Device

Then, a method of manufacturing the light emitting device 100 according to the first embodiment will be described with reference to the drawings.

As shown in FIG. 3, the reflecting layer 104 and the buffer layer 106 are grown epitaxially on the substrate 102 in this order. As the method of achieving the epitaxial growth, there can be cited, for example, an MOCVD (Metal Organic Chemical Vapor Deposition) method and an MBE (Molecular Beam Epitaxy) method.

Then, the mask layer 128 is formed on the buffer layer 106 using the MOCVD method or the MBE method. Then, the semiconductor layer 112, the light emitting layer 114, and the semiconductor layer 116 are grown epitaxally on the buffer layer 106 in this order using the mask layer 128 as a mask. As the method of achieving the epitaxial growth, there can be cited, for example, the MOCVD method and the MBE method. Due to the present process, it is possible to form the columnar parts 110. Then, the light propagation layers 118 are formed between the columnar parts 110 adjacent to each other using a spin coat method or the like. Due to the present process, it is possible to form the photonic crystal structure 108.

Then, the semiconductor layer 120 is formed on the columnar parts 110 and the light propagation layers 118 using, for example, the MOCVD method or the MBE method.

Subsequently, the first electrode 122 and the second electrode 124 are formed using, for example, a vacuum evaporation method.

According to the process described hereinabove, it is possible to manufacture the light emitting device 100.

2. Second Embodiment 2.1. Light Emitting Device

Figure 5:
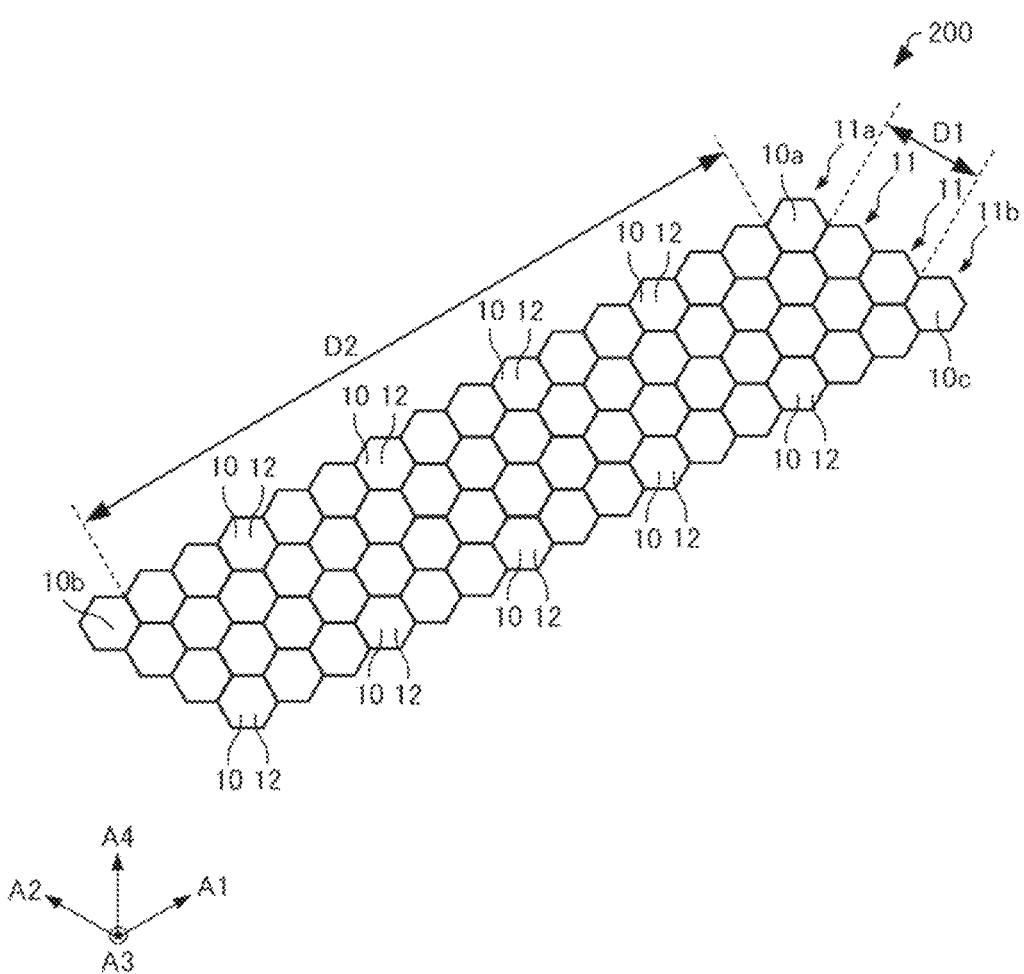
FIG. 5 is a plan view schematically showing a light emitting device according to a second embodiment.
Figure 6:
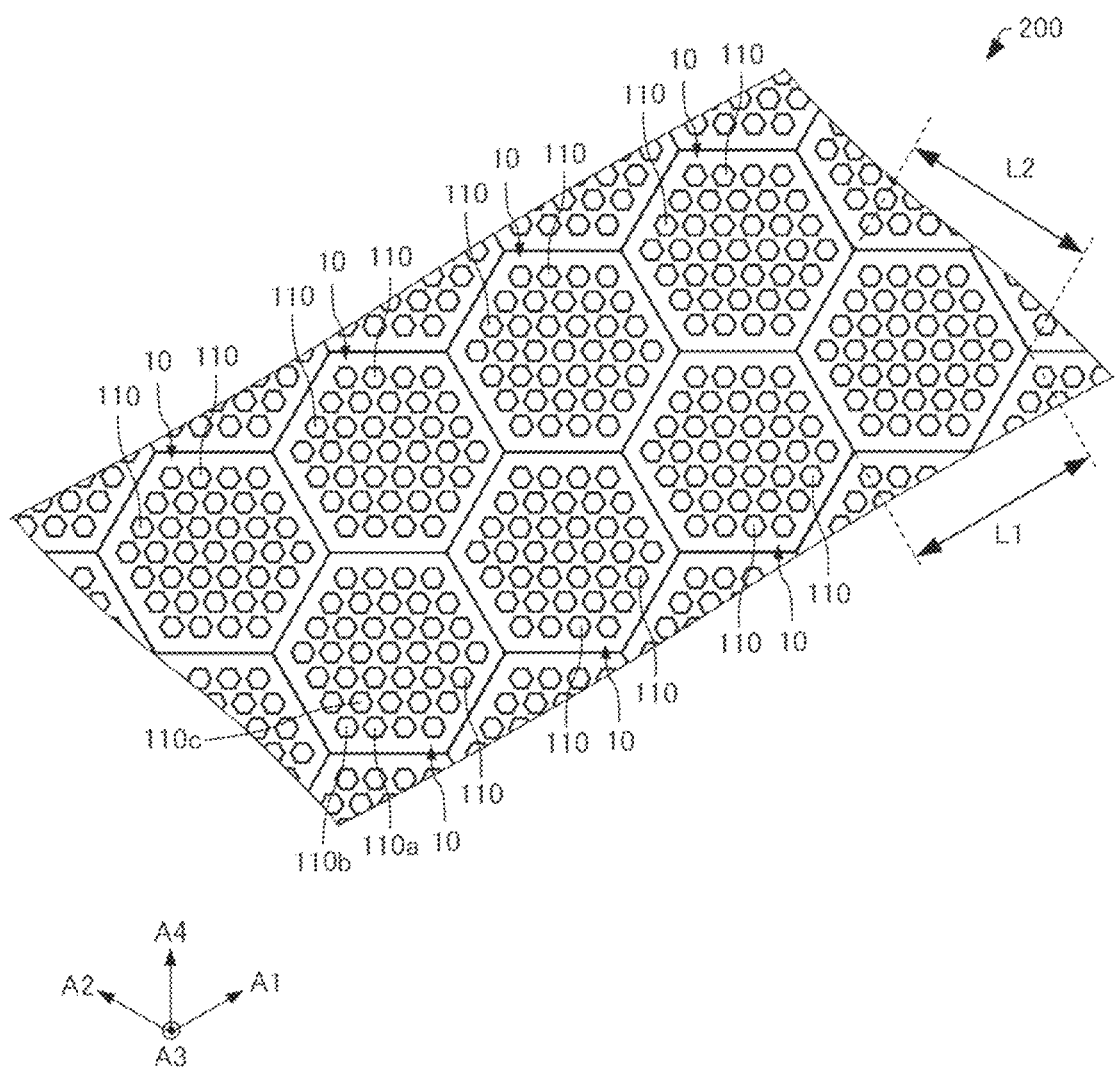
FIG. 6 is a plan view schematically showing the light emitting device according to the second embodiment.

Then, a light emitting device according to a second embodiment will be described with reference to the drawings. FIG. 5 and FIG. 6 are each a plan view schematically showing the light emitting device 200 according to the second embodiment. It should be noted that in FIG. 5, the light emitting device 200 is illustrated in a simplified manner for the sake of convenience. Further, in FIG. 6, the illustration of members other than columnar parts 110 of the photonic crystal structure 108 is omitted. Further, in FIG. 5 and FIG. 6, the first direction A1, the second direction A2, the third direction A3, and a fourth axis A4 are shown as four axes crossing each other.

Hereinafter, in the light emitting device 200 according to the second embodiment, the members having substantially the same functions as those of the constituent members of the light emitting device 100 according to the first embodiment described above will be denoted by the same reference symbols, and the detailed descriptions thereof will be omitted.

In the light emitting device 100 described above, the columnar parts 110 are arranged so as to form the square lattice as shown in FIG. 2. Further, in the light emitting device 100, q of the resonant parts 10 are arranged along the first direction A1 to form the row 11, and the rows 11 are arranged as much as r along the second direction A2 perpendicular to the first direction A1.

In contrast, in the light emitting device 200, a plurality of columnar parts 110 is arranged so as to form an equilateral-triangular lattice as shown in FIG. 6.

In the light emitting device 200, the second direction A2 is tilted 120° with respect to the first direction A1 as shown in FIG. 5 and FIG. 6. In other words, the rows 11 are arranged as much as r along the second direction tilted 120° with respect to the first direction A1. The fourth axis A4 is tilted 60° with respect to the first direction A1. The fourth axis A4 is tilted 60° with respect to the second direction A2. The third direction A3 is perpendicular to a plane including the first direction A1, the second direction A2, and the fourth axis A4.

As shown in FIG. 6, a columnar part 110a out of the plurality of columnar parts 110 is the columnar part 110 adjacent to a columnar part 110b in a direction along an axis obtained by rotating the first direction A1 clockwise as much as 30°. A columnar part 110c out of the plurality of columnar parts 110 is the columnar part 110 adjacent to the columnar part 110b in a direction along an axis obtained by rotating the first direction A1 counterclockwise as much as 30°. A diagram formed of a straight line connecting the center of the columnar part 110a and the center of the columnar part 110b, a straight line connecting the center of the columnar part 110b and the center of the columnar part 110c, and a straight line connecting the center of the columnar part 110c and the center of the columnar part 110a is an equilateral triangle.

In the light emitting device 200, the plurality of resonant directions comprises a direction along the first direction A1, a direction along the second direction A2, and a direction along the fourth axis A4. In the resonant part 10, the lengths in the direction along the first direction A1, the direction along the second direction A2, and the direction along the fourth axis A4 are all equal to each other. In the plan view, for example, in the resonant part 10, a distance between the center of the columnar part 110 located the furthest at the one side of the first direction A1 and the center of the columnar part 110 located the furthest at the other side of the first direction A1, a distance between the center of the columnar part 110 located the furthest at the one side of the second direction A2 and the center of the columnar part 110 located the furthest at the other side of the second direction A2, and a distance between the center of the columnar part 110 located the furthest at one side of the fourth axis A4 and the center of the columnar part 110 located the furthest at the other side of the fourth axis A4 are equal to each other. In the plan view, the shape of the resonant part 10 is, for example, a regular hexagon. In the plan view, a diagram formed of straight lines connecting the centers of the columnar parts 110 located at the outermost circumference out of the plurality of columnar parts 110 constituting the resonant part 10 is, for example, a regular hexagon.

2.2. Method of Manufacturing Light Emitting Device

Then, a method of manufacturing the light emitting device 200 according to the second embodiment will be described. The method of manufacturing the light emitting device 200 according to the second embodiment is basically the same as the method of manufacturing the light emitting device 100 according to the first embodiment described above. Therefore, the detailed description thereof will be omitted.

3. Third Embodiment

3.1. Projector

Figure 7:
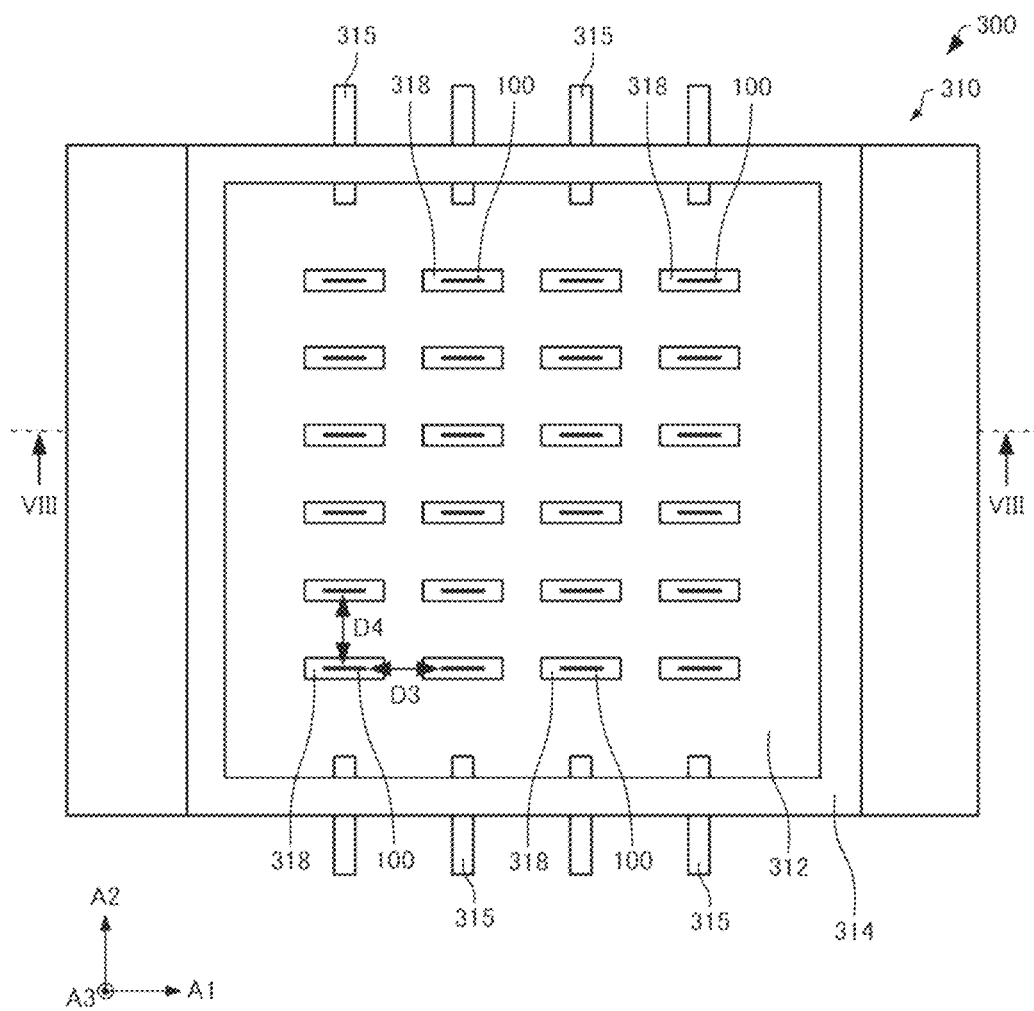
FIG. 7 is a plan view schematically showing a light sources module of a projector according to a third embodiment.
Figure 8:
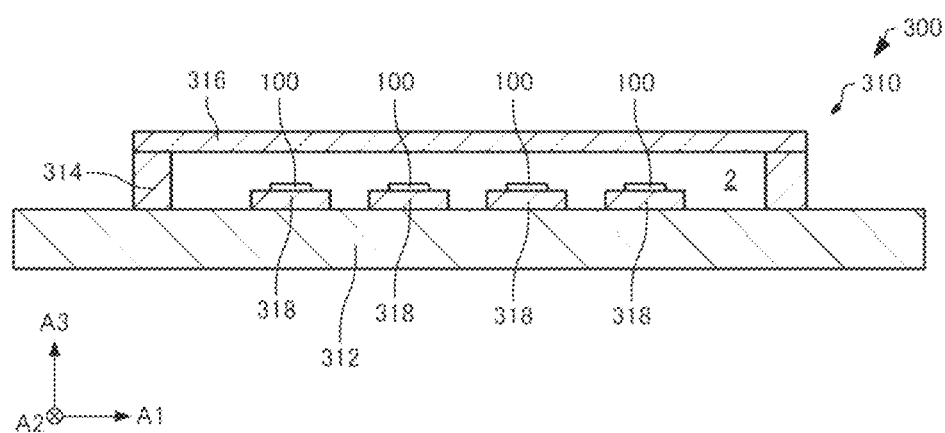
FIG. 8 is a cross-sectional view schematically showing the light sources module of the projector according to the third embodiment.

Then, a projector according to a third embodiment will be described with reference to the drawings. Firstly, a light source module provided to the projector according to the third embodiment will be described. FIG. 7 is a plan view schematically showing the light source module 310 of the projector 300 according to the third embodiment. FIG. 8 is a cross-sectional view along the line VIII-VIII shown in FIG. 7 schematically showing the light source module 310 of the projector 300 according to the third embodiment.

As shown in FIG. 7 and FIG. 8, the light source module 310 is provided with, for example, the light emitting devices 100, a base member 312, a frame member 314, a lid member 316, and sub-mounts 318. It should be noted that in FIG. 7, the illustration of the lid member 316 is omitted for the sake of convenience. Further, in FIG. 7 and FIG. 8, the light emitting devices 100 are illustrated in a simplified manner.

The base member 312 is, for example, a plate-like member. It is preferable for the base member 312 to be high in thermal conductivity. Thus, it is possible to release the heat generated in the light emitting devices 100. The material of the base member 312 is, for example, copper, kovar (an alloy obtained by combining nickel and cobalt with iron), or aluminum nitride.

As shown in FIG. 8, the frame member 314 couples the base member 312 and the lid member 316 to each other. The frame member 314 is disposed along the outer circumference of the base member 312 in the plan view. It is preferable for the thermal expansion coefficient of the frame member 314 to be approximate to the thermal expansion coefficient of the lid member 316. Thus, it is possible to reduce the stress caused in the light source module 310 by a difference in thermal expansion coefficient between the frame member 314 and the lid member 316. The material of the frame member 314 is, for example, kovar.

The frame member 314 is provided with terminals 315. In the illustrated example, the terminals 315 each penetrate the frame member 314. The terminals 315 are electrically coupled to the light emitting devices 100 via interconnections not shown.

The lid member 316 is a sealing member for closing an opening of a recessed part defined by the base member 312 and the frame member 314. The lid member 316 transmits the light emitted from the light emitting devices 100. As the lid member 316, there is used, for example, a sapphire substrate. The light emitting devices 100 are disposed in a space 2 formed by the base member 312, the frame member 314, and the lid member 316. The space 2 can be set as a nitrogen atmosphere.

The sub-mounts 318 are disposed on the base member 312. The sub-mounts 318 are respectively disposed between the base member 312 and the light emitting devices 100. The plurality of sub-mounts 318 is disposed so as to correspond to the plurality of light emitting devices 100.

It is preferable for the sub-mounts 318 to be high in thermal conductivity. Thus, it is possible to release the heat generated in the light emitting devices 100. It is preferable for the thermal expansion coefficient of the sub-mounts 318 to be approximate to the thermal expansion coefficient of the base member 312 and the thermal expansion coefficient of the light emitting devices 100. Thus, it is possible to reduce the stress caused in the light source module 310 due to a difference in thermal expansion coefficient between the sub-mounts 318 and the base member 312, and a difference in thermal expansion coefficient between the sub-mounts 318 and the light emitting devices 100. The material of the sub-mounts 318 is, for example, aluminum nitride or aluminum oxide.

The light emitting devices 100 are respectively disposed on the sub-mounts 318. The number of the light emitting devices 100 disposed is, for example, more than one. In the illustrated example, the plurality of light emitting devices 100 is arranged in a matrix in a direction along the first direction A1 and a direction along the second direction A2. A distance D3 between the light emitting devices 100 adjacent to each other in the direction along the first direction A1 and a distance D4 between the light emitting devices 100 adjacent to each other in the direction along the second direction A2 are, for example, equal to each other. It should be noted that a first distance between areas where the plurality of resonant parts 10 is disposed in the light emitting devices 100 adjacent to each other in the direction along the first direction A1 can be equal to a second distance between areas where the plurality of resonant parts 10 is disposed in the light emitting devices 100 adjacent to each other in the direction along the second direction A2. Further, a third distance between substantially centers of the areas where the plurality of resonant parts 10 is disposed in the light emitting devices 100 adjacent to each other in the direction along the first direction A1 can be equal to a fourth distance between substantially centers of the areas where the plurality of resonant parts 10 is disposed in the light emitting devices 100 adjacent to each other in the direction along the second direction A2. Since it is possible for the light emitting devices 100 to emit the light having the isotropic light distribution angle, by realizing D3=D4, it is possible to obtain illumination light having a substantially homogenous intensity distribution on an illumination target distant as much as a predetermined distance L from the light emitting devices 100. Depending on a magnitude relationship between the size of the area where the plurality of resonant parts 10 is disposed and the distance L, it is possible to obtain the effect described above when realizing (the first distance)=(the second distance), and it is possible to obtain the effect described above when realizing (the third distance)=(the fourth distance).

Figure 9:
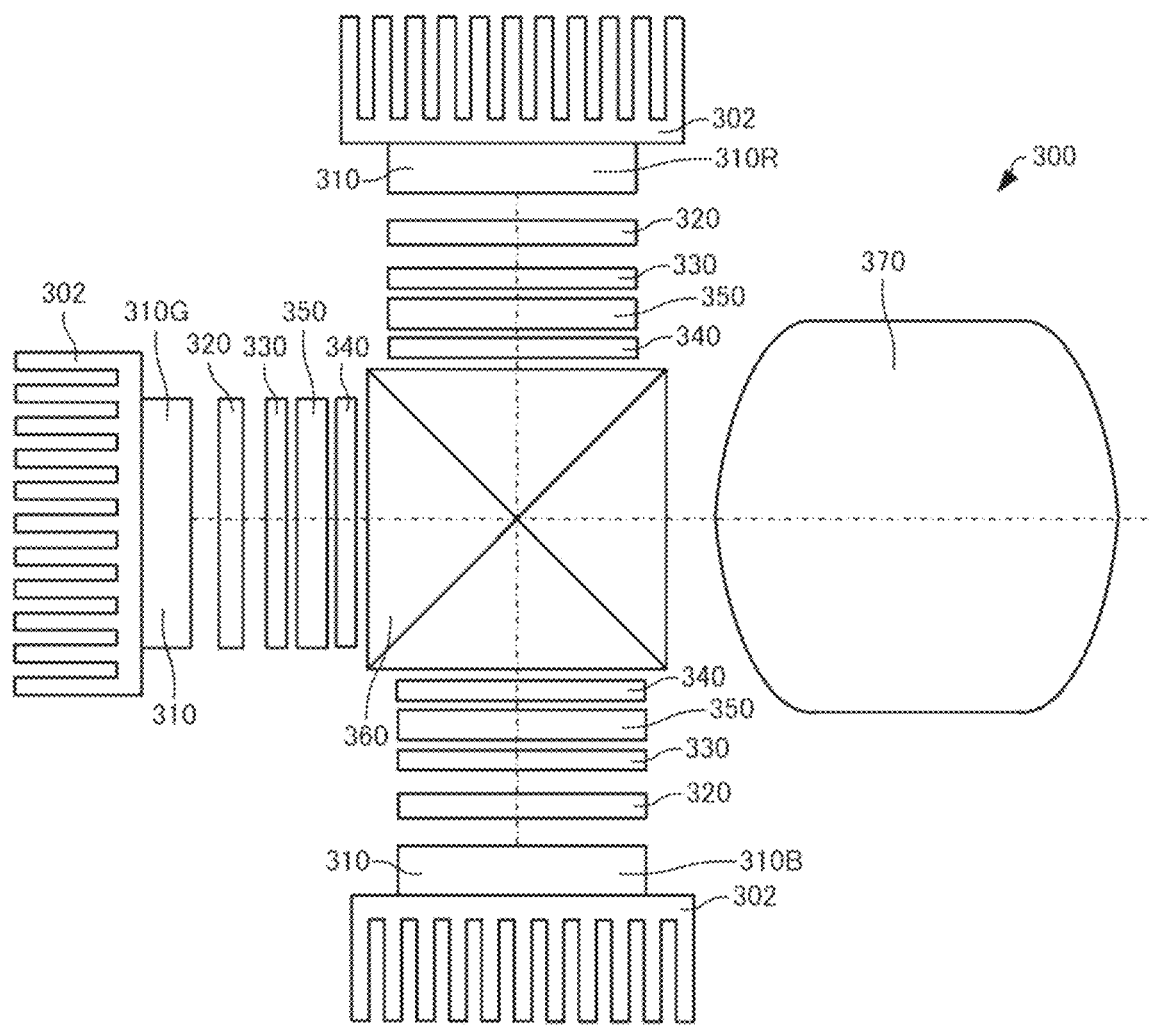
FIG. 9 is a diagram schematically showing the projector according to the third embodiment.

Then, a configuration of the projector 300 will be described. FIG. 9 is a diagram schematically showing the projector 300 according to the third embodiment.

As shown in FIG. 9, the projector 300 has, for example, light source modules 310R, 310G, and 310B, diffusion elements 320, first polarization plates 330, second polarization plates 340, light modulation elements 350, a colored light combining prism 360, and a projection lens 370. It should be noted that in FIG. 9, the light source modules 310R, 310G, and 310B are illustrated in a simplified manner for the sake of convenience.

The light source module 310R emits red light. The light source module 310G emits green light. The light source module 310B emits blue light. The light source modules 310R, 310G, and 310B are each, for example, a light source module 310 having the light emitting devices 100. In the illustrated example, on one surface of each of the light source modules 310R, 310G, and 310B, there is disposed a radiator fin 302. The radiator fins 302 radiate the heat generated in the light source modules 310R, 310G, and 310B. Thus, it is possible to suppress heating in the light source modules 310R, 310G, and 310B to enhance the luminous efficiency.

The light emitted from the light source modules 310R, 310G, and 310B enters the diffusion elements 320, respectively. The diffusion elements 320 homogenize the intensity distributions of the light emitted from the light source modules 310R, 310G, and 310B, respectively.

The light modulation elements 350 modulate the light emitted from the light source modules 310R, 310G, and 310B, respectively, in accordance with image information. The light modulation elements 350 are, for example, transmissive liquid crystal light valves for transmitting the light emitted from the light source modules 310R, 310G, and 310B, respectively. The projector 300 is an LCD (liquid crystal display) projector.

On the incident side of each of the light modulation elements 350, there is disposed the first polarization plate 330. The first polarization plates 330 adjust polarization directions and polarization degrees of the light emitted from the light source modules 310R, 310G, and 310B, respectively. Specifically, the first polarization plates 330 are each an optical element for transmitting only the linearly polarized light in a specific direction. Due to the first polarization plate 330, it is possible to uniform the polarization direction of the light entering the light modulation element 350.

On the exit side of each of the light modulation elements 350, there is disposed the second polarization plate 340. The second polarization plates 340 function as analyzers with respect to the light emitted from the light source modules 310R, 310G, and 310B, respectively. The light emitted from the second polarization plate 340 enters the colored light combining prism 360.

The colored light combining prism 360 combines the light emitted from the light source module 310R and then transmitted through the light modulation element 350, the light emitted from the light source module 310G and then transmitted through the light modulation element 350, and the light emitted from the light source module 310B and then transmitted through the light modulation element 350 with each other. The colored light combining prism 360 is, for example, a cross dichroic prism which is formed by bonding four rectangular prisms to each other, and is provided with a dielectric multilayer film for reflecting the red light and a dielectric multilayer film for reflecting the blue light disposed on the inside surfaces thereof.

The projection lens 370 projects the light combined by the colored light combining prism 360, namely image light formed by the light modulation elements 350, on a screen not shown. An enlarged image is displayed on the screen.

The projector 300 has the light emitting devices 100 which can emit the light having the isotropic light distribution angle, and is easy to release the heat, and can therefore achieve high-intensity display. Therefore, it is possible to realize a high display performance.

It should be noted that although not shown in the drawings, the projector 300 can be an LCoS (Liquid Crystal on Silicon) projector having reflective liquid crystal light valves for reflecting the light emitted from the light source modules 310R, 310G, and 310B.

3.2. Modified Example of Projector

Figure 10:
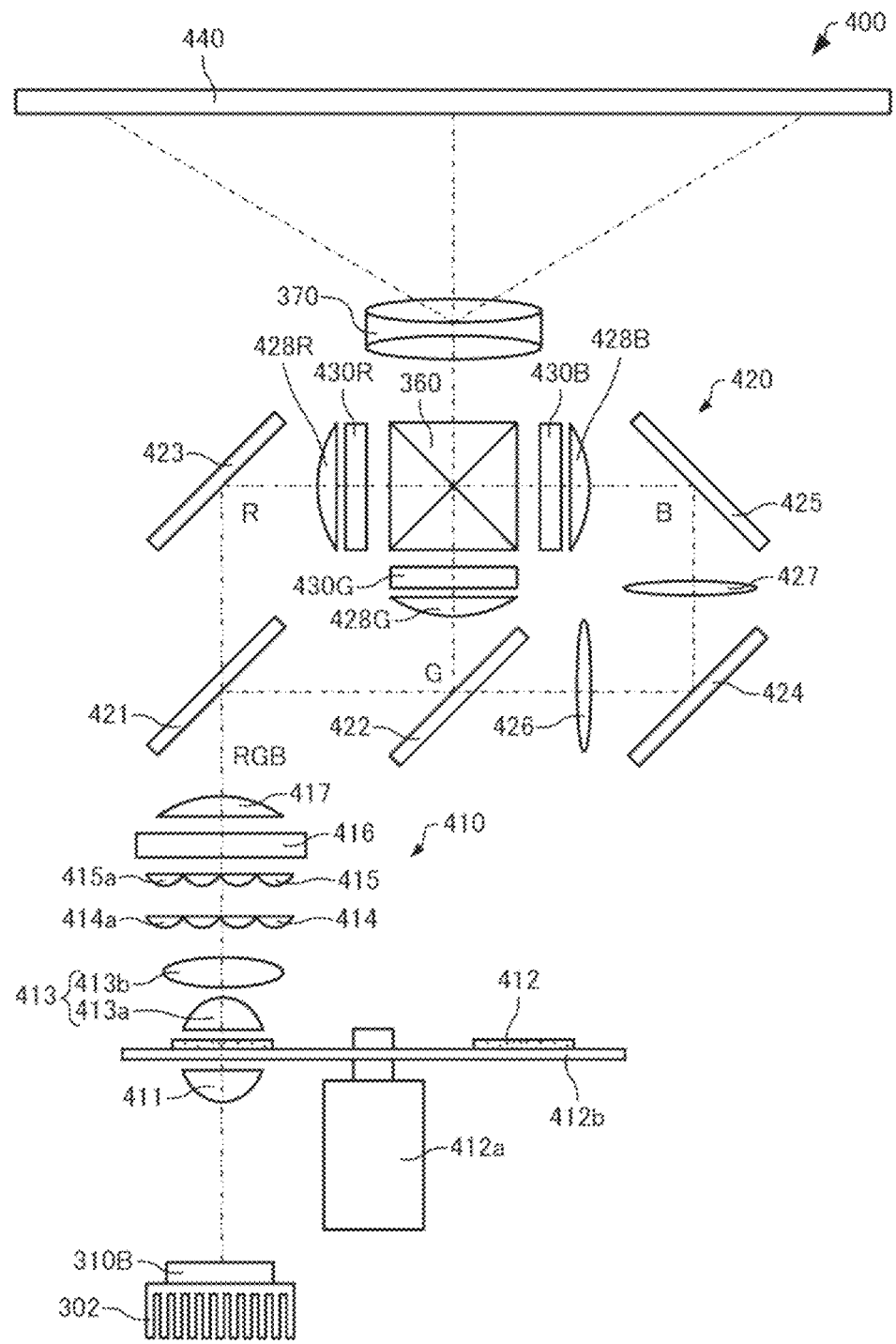
FIG. 10 is a diagram schematically showing a projector according to a modified example of the third embodiment.

Then, a projector according to a modified example of the third embodiment will be described with reference to the drawing. FIG. 10 is a diagram schematically showing the projector 400 according to the modified example of the third embodiment.

Hereinafter, in the projector 400 according to the modified example of the third embodiment, the members having substantially the same functions as those of the constituent members of the projector 300 according to the third embodiment described above will be denoted by the same reference symbols, and the detailed descriptions thereof will be omitted.

The projector 300 described above has the light source modules 310R, 310G, and 310B as shown in FIG. 9.

In contrast, the projector 400 has the light source module 310B, but does not have the light source modules 310R, 310G as shown in FIG. 10.

As shown in FIG. 10, the projector 400 has a light source 410, a color separation optical system 420, light modulation elements 430R, 430G, and 430B, the colored light combining prism 360, and the projection lens 370.

The light source 410 has the light source module 310B, a light collection optical system 411, a phosphor 412, a collimating optical system 413, lens arrays 414, 415, a polarization conversion element 416, and a superimposing lens 417.

The light emitted from the light source module 310B enters the light collection optical system 411. The light collection optical system 411 collects the light emitted from the light source module 310B. The light collection optical system 411 is formed of, for example, a convex lens. The light emitted from the light collection optical system 411 enters the phosphor 412. Since the focus of the light collection optical system 411 is substantially set on the phosphor 412, the cross-sectional shape and the intensity distribution of the light entering the phosphor 412 become those reflecting the light distribution angle of the light emitted from the light source module 310B.

When exciting the phosphor to generate the fluorescence, the fluorescence generation efficiency is basically proportional to the intensity of the excitation light, but degrades when exceeding a predetermined intensity. Therefore, when exciting the phosphor, it is desirable to use the light having a substantially homogenous intensity distribution approximate to a top hat type not having a sharp peak in the intensity of the light.

Since the light emitted from the light emitting devices 100 of the light source module 310B has the isotropic light distribution angle as described above, it is possible to obtain the excitation light having the intensity distribution approximate to the top hat type with, for example, the simple light collection optical system 411 provided with few refractive surfaces. Thus, in the projector 400, it is possible to realize the high fluorescence generation efficiency, and it is possible to obtain high light output. Therefore, it is possible to realize a high-intensity projector. On the other hand, when the light emitted is not isotropic, it is necessary to use a light collection optical system provided with, for example, a number of refractive surfaces or toric surfaces, and the light collection optical system becomes complicated in some cases.

Figure 11:
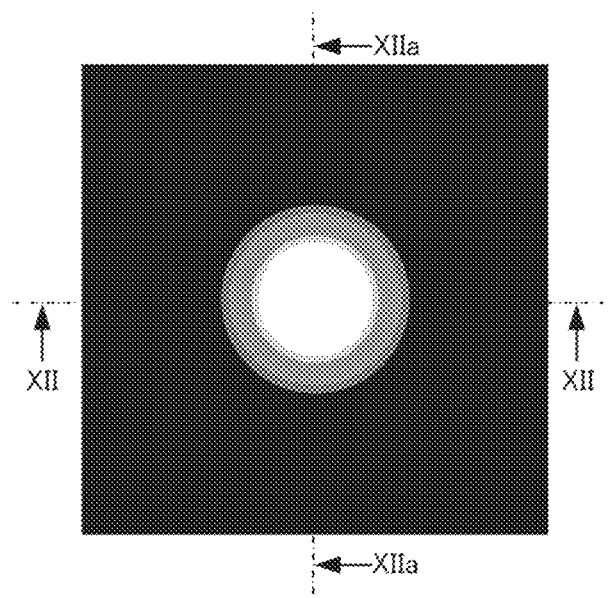
FIG. 11 is a diagram for explaining light emitted from a light collection optical system of the projector according to the modified example of the third embodiment.
Figure 12:
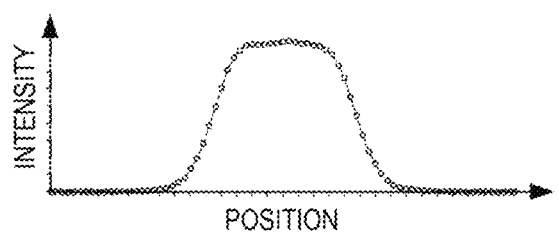
FIG. 12 is a diagram for explaining the light emitted from the light collection optical system of the projector according to the modified example of the third embodiment.

FIG. 11 and FIG. 12 are diagrams for explaining the intensity distribution of the light emitted from the light collection optical system 411. It should be noted that in FIG. 11, there is shown the fact that the brighter a portion is, the higher the intensity of the light in that portion is. Further, FIG. 12 is a cross-sectional view along the line XII-XII shown in FIG. 11. The cross-sectional surface along the XIIa-XIIa line shown in FIG. 11 also has substantially the same intensity distribution as shown in FIG. 12. As shown in FIG. 11 and FIG. 12, it is possible for the light emitted from the light collection optical system 411 to have the intensity distribution approximate to the top hat type.

Figure 13:
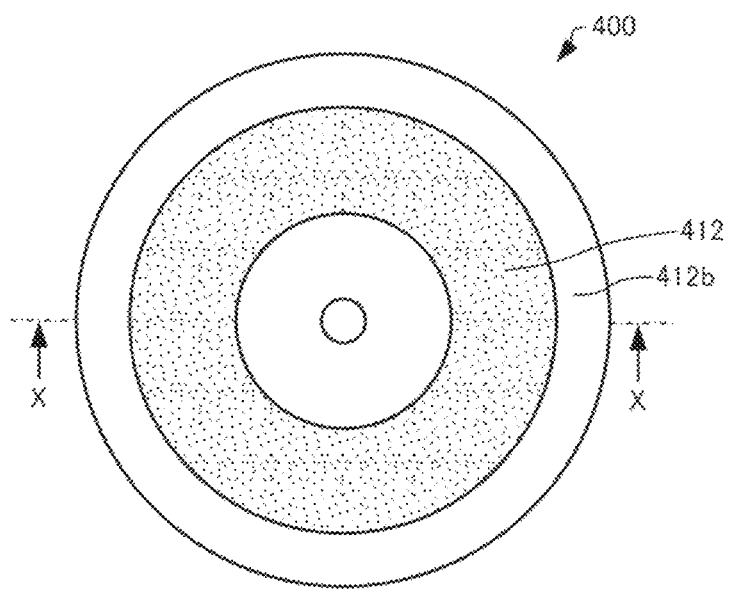
FIG. 13 is a diagram schematically showing a phosphor of the projector according to the modified example of the third embodiment.

FIG. 13 is a diagram schematically showing the phosphor 412. The phosphor 412 shown in FIG. 10 corresponds to the cross-sectional view along the line X-X shown in FIG. 13.

As shown in FIG. 10 and FIG. 13, the phosphor 412 is disposed on a circular disk 412b which can be rotated by a motor 412a. The phosphor 412 is disposed along a circumferential direction of the circular disk 412*b*. The phosphor 412 is excited by the light emitted from the light collection optical system 411 to emit the fluorescence consisting of the red light and the green light, namely the fluorescence consisting of yellow light. The phosphor 412 transmits a part of the blue light emitted from the light collection optical system 411. The phosphor 412 is, for example, a Ce:YAG (Yttrium Aluminum Garnet) type phosphor including cerium as an activator agent.

The circular disk 412*b* transmits the blue light emitted from the light source module 310B. The material of the circular disk 412*b* is, for example, quartz glass, quartz crystal, sapphire, or resin.

As shown in FIG. 10, the collimating optical system 413 has a lens 413*a* for suppressing spread of the light emitted from the phosphor 412, and a lens 413*b* for collimating the light emitted from the lens 413*a*, and collimates the light emitted from the phosphor 412 as a whole. The lenses 413*a*, 413*b* are each formed of a convex lens.

The lens array 414 has a plurality of lenses 414*a*, the lens array 415 has a plurality of lenses 415*a*, and the lenses 414*a* and the lenses 415*a* are set so as to correspond one-to-one to each other. The light having entered the lens array 414 is divided by the plurality of lenses 414*a* into a plurality of light beams, and then enters the corresponding lenses 415*a* of the lens array 415.

The polarization conversion element 416 uniforms the polarization state of the light beams emitted from the plurality of lenses 415*a* of the lens array 415 to output the result as, for example, P-polarized light.

The superimposing lens 417 changes the proceeding directions of the plurality of light beams emitted from the polarization conversion element 416 to converge the plurality of light beams on the illumination target area of each of the light modulation elements 430. Due to the process described above, the light emitted from the collimating optical system 413 is uniformed in the polarization state of the light and at the same time converted into the light having the homogenous intensity distribution on the illumination target area of each of the light modulation elements 430 by the lens arrays 414, 415, the polarization conversion element 416, and the superimposing lens 417.

The color separation optical system 420 has dichroic mirrors 421, 422, mirrors 423, 424, and 425, relay lenses 426, 427, and field lenses 428R, 428G, and 428B. The dichroic mirrors 421, 422 are each formed by, for example, stacking a dielectric multilayer film on a glass surface. The dichroic mirrors 421, 422 have a property of selectively reflecting the colored light in a predetermined wavelength band, and transmitting the colored light in the other wavelength band. Here, the dichroic mirror 421 reflects the green light and the blue light. The dichroic mirror 422 reflects the green light.

The light emitted from the superimposing lens 417 is white light including the red light R, the green light G, and the blue light B, and enters the dichroic mirror 421.

The red light R included in the white light passes through the dichroic mirror 421 to enter the mirror 423, and is then reflected by the mirror 423 to enter the field lens 428R. The red light R is collimated by the field lens 428R, and then enters the light modulation element 430R.

The green light G included in the white light is reflected by the dichroic mirror 421, and is then further reflected by the dichroic mirror 422 to enter the field lens 428G. The green light G is collimated by the field lens 428G, and then enters the light modulation element 430G.

The blue light B included in the white light is reflected by the dichroic mirror 421, then passes through the dichroic mirror 422 and the relay lens 426, and is then reflected by the mirror 424, and is further transmitted through the relay lens 427, and then reflected by the mirror 425 to enter the field lens 428B. The blue light B is collimated by the field lens 428B, and then enters the light modulation element 430B.

The light modulation elements 430R, 430G, and 430B are each, for example, a transmissive liquid crystal light valve. The light modulation elements 430R, 430G, and 430B are electrically coupled to a signal source such as a PC (Personal Computer) for supplying an image signal including the image information. The light modulation elements 430R, 430G, and 430B each modulate the incident light pixel by pixel to form an image based on the image signal thus supplied. The light modulation elements 430R, 430G, and 430B form a red image, a green image, and a blue image, respectively. The image light modulated by the light modulation elements 430R, 430G, and 430B enters the colored light combining prism 360.

In the colored light combining prism 360, the three colors of image light are superimposed on each other to thereby be combined with each other, and the color image light thus combined is projected by the projection lens 370 on a screen 440 in an enlarged manner to form a color image.

In the present disclosure, some of the constituents can be omitted, or the embodiments and the modified example can be combined with each other within a range in which the features and the advantages described in the specification are provided.

The present disclosure is not limited to the embodiments described above, but can further variously be modified. For example, the present disclosure includes substantially the same configuration as the configurations described in the embodiments. Substantially the same configuration denotes a configuration substantially the same in, for example, function, way, and result, or a configuration substantially the same in object and advantage. Further, the present disclosure includes configurations obtained by replacing a non-essential part of the configuration explained in the above description of the embodiments. Further, the present disclosure includes configurations providing the same functions and the same advantages or configurations capable of achieving the same object as that of the configurations explained in the description of the embodiments. Further, the present disclosure includes configurations obtained by adding a known technology to the configuration explained in the description of the embodiments.

What is claimed is:
1. A light emitting device comprising:
a plurality of resonant parts constituted by a photonic crystal structure, and
a plurality of rows each of which includes the resonant parts arranged along a first direction, wherein
light resonating in the resonant part resonates in a first resonant direction and a second resonant direction intersecting the first resonant direction,
the rows are arranged along a second direction intersecting the first direction, p represents number of the resonant parts, represents number of the rows, and r represents number of the resonant parts in each rows, p, q, and r, are satisfy p=q×r, the rows include a first row located furthest at one side of the second direction among the rows, and a second row located furthest at the other side of the second direction among the rows, a distance between the resonant part located furthest at one side of the first direction in the first row and the resonant part located furthest at the one side of the first direction in the second row is different from a distance between the resonant part located furthest at the one side of the first direction and the resonant part located furthest at another side of the first direction in the first row, the first resonant direction is along the first direction and the second resonant direction is along the second direction, and in a plan view viewed from a direction along a third direction perpendicular to a plane including the first direction and the second direction, a length along the first direction of the resonant part and a length along the second direction of the resonant part are equal to each other.

2. The light emitting device according to claim 1, wherein the resonant part includes a plurality of nano-structures, the nano-structures are arranged so as to form a square lattice, the first direction and the second direction are perpendicular to each other.

3. The light emitting device according to claim 1, wherein the resonant part includes a plurality of nano-structures, the nano-structures are arranged so as to form an equilateral-triangular lattice, light resonating in the resonant part resonates in a fourth resonant direction, the second direction is tilted 120° with respect to the first direction, and the third resonant direction is tilted 60° with respect to the first resonant direction, and the third direction is tilted 60° with respect to the second resonant direction.

4. A projector comprising:
the light emitting device according to claim 1.

5. The projector according to claim 4, further comprising:
a light collection optical system configured to collect light emitted from the light source device; and
a phosphor to be excited by light emitted from the light collection optical system.

* * * * *